(12) United States Patent
Kim et al.

(10) Patent No.: US 10,164,211 B2
(45) Date of Patent: Dec. 25, 2018

(54) LIGHTING APPARATUS USING ORGANIC LIGHT EMITTING DEVICE AND METHOD OF FABRICATING THEREOF

(71) Applicant: LG DISPLAY CO., LTD., Seoul (KR)

(72) Inventors: Namkook Kim, Suwon-si (KR); Soonsung Yoo, Goyang-si (KR); Taejoon Song, Paju-si (KR); Jungeun Lee, Seoul (KR); Shinbok Lee, Seoul (KR); Kyungha Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/703,329

(22) Filed: Sep. 13, 2017

(65) Prior Publication Data

US 2018/0123088 A1 May 3, 2018

(30) Foreign Application Priority Data

Oct. 31, 2016 (KR) ........................ 10-2016-0143697

(51) Int. Cl.
*H01L 51/56* (2006.01)
*H01L 51/00* (2006.01)
*H01L 51/52* (2006.01)

(52) U.S. Cl.
CPC ...... *H01L 51/5246* (2013.01); *H01L 51/0012* (2013.01); *H01L 51/0097* (2013.01); *H01L 51/5212* (2013.01); *H01L 51/5237* (2013.01); *H01L 51/5253* (2013.01); *H01L 51/56* (2013.01); *H01L 2251/5338* (2013.01); *H01L 2251/5361* (2013.01)

(58) Field of Classification Search
None
See application file for complete search history.

(56) References Cited

U.S. PATENT DOCUMENTS

| | | | | |
|---|---|---|---|---|
| 8,395,569 | B2 * | 3/2013 | Min | H01L 27/3253 257/88 |
| 9,023,678 | B2 * | 5/2015 | Heo | H01L 51/56 438/82 |
| 9,478,591 | B2 * | 10/2016 | Nam | H01L 27/3246 |
| 2005/0019977 | A1 | 1/2005 | Prakash | |
| 2013/0112962 | A1 * | 5/2013 | Lee | H01L 51/5212 257/40 |
| 2014/0154829 | A1 * | 6/2014 | Oh | H01L 27/3246 438/46 |
| 2014/0159002 | A1 * | 6/2014 | Lee | H01L 27/3246 257/40 |

(Continued)

*Primary Examiner* — Joseph Schoenholtz
(74) *Attorney, Agent, or Firm* — Seed Intellectual Property Law Group LLP

(57) ABSTRACT

According to the present disclosure, an organic light emitting material and a metal may be entirely deposited on a substrate without using an open mask to form an organic light emitting device, thereby facilitating application to a roll fabrication apparatus. A side surface of an organic light emitting layer may be exposed to the outside, but a step structure may be formed on an outer portion of the substrate, and the organic light emitting layer is disconnected between an outer region and a lighting region by the step of the step structure, thereby preventing moisture that penetrates into the organic light emitting layer in the outer region from being propagated to the organic light emitting layer in the lighting region.

22 Claims, 9 Drawing Sheets

(56) References Cited

U.S. PATENT DOCUMENTS

| | | | |
|---|---|---|---|
| 2014/0312323 A1* | 10/2014 | Park | H01L 51/525 257/40 |
| 2015/0102332 A1* | 4/2015 | Shin | H01L 51/5259 257/40 |
| 2015/0228926 A1 | 8/2015 | Washio et al. | |
| 2017/0278912 A1* | 9/2017 | Kim | H01L 27/3246 |

* cited by examiner

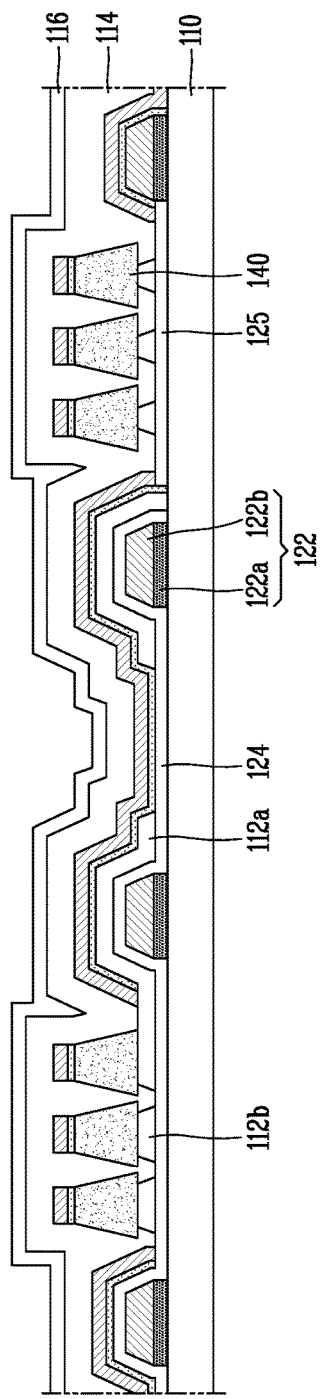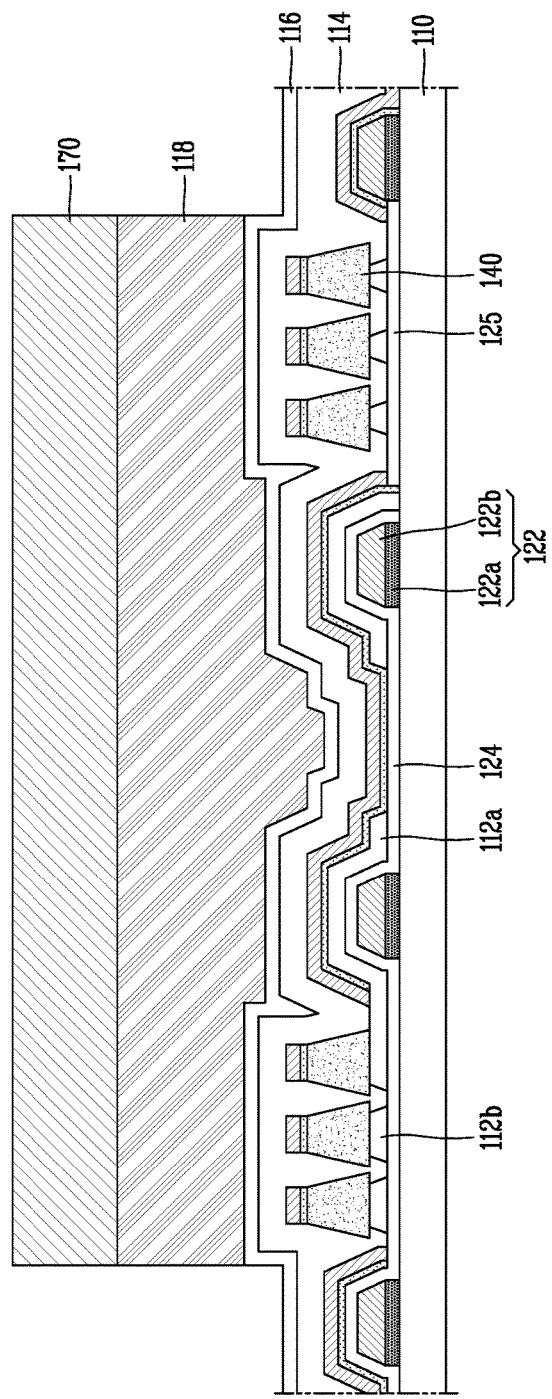

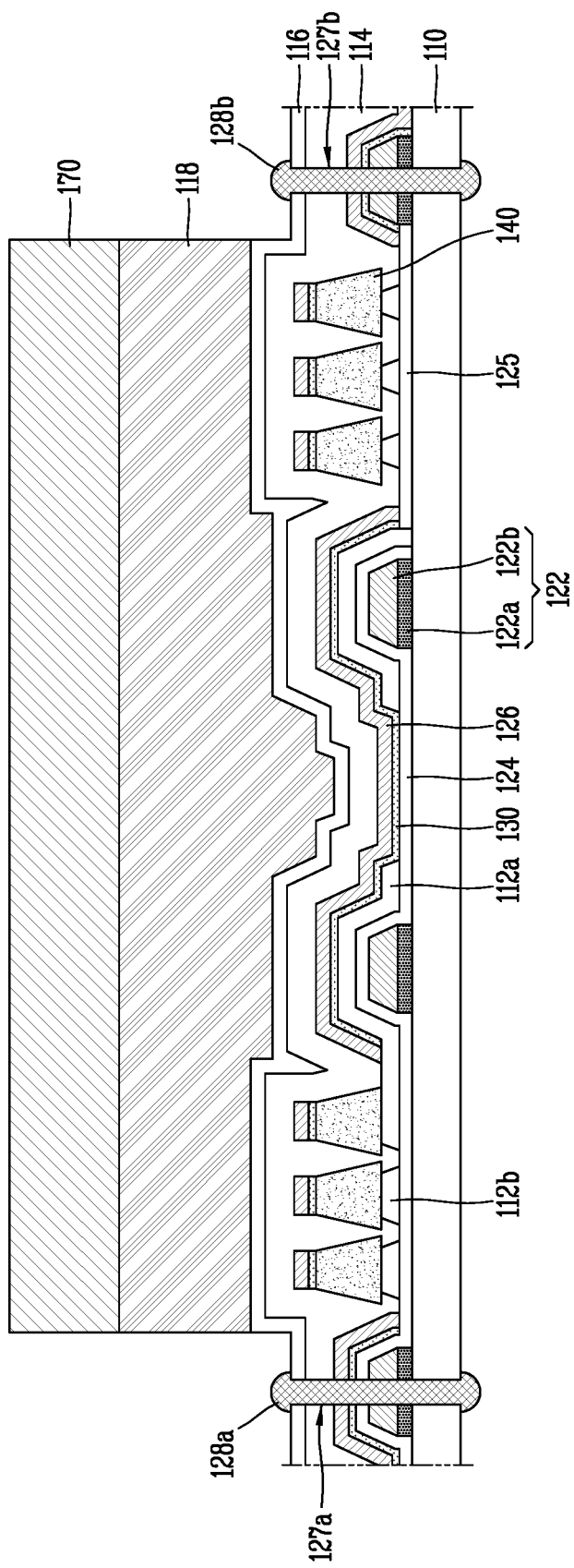

LIGHTING APPARATUS USING ORGANIC LIGHT EMITTING DEVICE AND METHOD OF FABRICATING THEREOF

CROSS-REFERENCE TO RELATED APPLICATIONS

This application claims the benefit of Korean Patent Application No. 10-2016-0143697, filed on Oct. 31, 2016, which is hereby incorporated by reference for all purposes as if fully set forth herein.

BACKGROUND OF THE INVENTION

Technical Field

The present disclosure relates to a lighting apparatus using an organic light emitting device with a simplified fabrication process, and a fabrication method thereof.

Description of the Related Art

In recent years, fluorescent and incandescent lamps have been mainly used as a lighting apparatus. Among them, the incandescent lamp has a good color rendering index, but has a low energy efficiency. Fluorescent lamps, on the other hand, have good energy efficiency, but have a low color rendering index. Additionally, fluorescent lamps contain mercury and thus present an environmental problem.

In order to overcome such problems of the lighting apparatus in the related art, in recent years, a light emitting diode (LED) has been proposed as a lighting apparatus. The light emitting diode is composed of an inorganic light emitting material, and has the highest luminous efficiency in a blue wavelength band, but has a lower luminous efficiency as it goes toward a red and a green wavelength band, which is a color having the highest visual sensitivity. Therefore, there is a problem in that the luminous efficiency is reduced when white light with a combination of a red light emitting diode, a green light emitting diode, and a blue light emitting diode is emitted. Furthermore, since the width of each emission peak is narrow when a red light emitting diode, a green light emitting diode, and a blue light emitting diode are used, there is also a problem in that the color rendering property deteriorates.

In order to solve such a problem, a lighting apparatus for combining a blue light emitting diode with a yellow colored phosphor instead of combining a red light emitting diode, a green light emitting diode and a blue light emitting diode to output white light has been proposed. The reason why the light emitting diode having such a structure is proposed is that a method of using only a blue light emitting diode having a higher luminous efficiency and using a fluorescent material that receives blue light to emit yellow light for the remaining colors is more efficient than that of using a green light emitting diode having a low luminous efficiency.

However, even in case of a lighting apparatus of combining a blue light emitting diode with a yellow colored phosphor to output white light, the fluorescent material itself that emits yellow light has a poor luminous efficiency, and thus there is a limit in enhancing the luminous efficiency of the lighting apparatus.

BRIEF SUMMARY

The present disclosure provides various embodiments which solve the aforementioned problems. In one or more embodiments, the present disclosure provides a lighting apparatus that can be fabricated by entirely depositing an organic light emitting layer on a substrate without using an open mask, and a fabrication method thereof.

The present disclosure further provides a lighting apparatus in which an organic light emitting layer is disconnected between a lighting region and an outer region by a bank layer, thereby preventing moisture from infiltrating into the organic light emitting layer in the lighting region, and a fabrication method thereof.

According to one or more embodiments of the present disclosure, an organic light emitting material and a metal may be entirely deposited on a substrate without using an open mask (e.g., a metal mask) to form an organic light emitting device. Since the organic light emitting material may be deposited on the substrate without requiring the use of an open mask, embodiments of the present application may be advantageously fabricated by a roll fabrication apparatus.

A side surface of an organic light emitting layer may be exposed to the outside, such as to an outside or ambient environment, without adverse effect, even though the organic light emitting material is entirely deposited on the substrate. This is due to a step structure, such as a bank layer or a partition wall forming a step, that is formed on an outer region, such as adjacent to an outer perimeter of the substrate. The organic light emitting layer may be disposed on a first electrode in the light emitting region, and on the step structure in the outer region, during the deposition of the organic light emitting material. Accordingly, the organic light emitting layer disposed on the first electrode in the lighting region and the organic light emitting layer disposed on the step structure in the outer region may be disconnected from each other by the step structure. Due to this disconnection of the organic light emitting layer at the step structure, moisture from the outside environment may be prevented from being propagated to the organic light emitting layer in the lighting region.

An auxiliary electrode may be disposed in a contact region and in the lighting region of the lighting apparatus. The auxiliary electrode may have, for example, a matrix shape, a mesh shape, a pentagonal shape, an octagonal shape, or a circular shape with a predetermined width. The auxiliary electrode facilitates application of a uniform voltage to the first electrode in the lighting region, which results in a more uniform luminance across the lighting region. Furthermore, a first contact electrode and a second contact electrode may be formed in the contact region of the substrate. The first contact electrode may be electrically coupled to the first electrode through a first through hole, and the second contact electrode may be electrically coupled to a second electrode through a second through hole.

A protective layer and a sealant may be provided on the lighting apparatus, with the protective layer covering the substrate and one or more components on the substrate, such as the auxiliary electrode, the step structure, the first electrode, the organic light emitting material, the second electrode, etc. The sealant may be provided on the protective layer, and a metal foil may be adhered to the sealant by an adhesive.

According to one or more embodiments of the present disclosure, the organic light emitting layer in the lighting region and the organic light emitting layer in the outer region may be disconnected from one another (i.e. the organic light emitting layer is discontinuous) by a step structure such as a bank layer or a partition wall, thereby preventing moisture that penetrates from an outside environment into the organic light emitting layer in the outside region from being propagated to the organic light emitting layer in the lighting region, i.e. the region where the lighting apparatus actually emits light along the organic light emitting layer. In addition, according to embodiments of the present disclosure, the organic light emitting layer may be disconnected due to the structural characteristics of the step structure (which may be referred to herein as a bank layer). Accordingly, due to the presence of the step structure, the organic light emitting layer may be deposited on the substrate without requiring the use of an open mask, and thus an additional fabrication process may be avoided, which may reduce the cost of manufacturing the lighting apparatus.

Moreover, according to embodiments provided by the present disclosure, a bank layer may be provided on the lighting apparatus and an organic light emitting material may be deposited on an entire surface of the substrate, and thus the organic light emitting layer may be disconnected by the bank layer even when a side surface of the organic light emitting layer is exposed to the outside, thereby preventing moisture from infiltrating into the lighting region through the exposed organic light emitting layer. Therefore, when the lighting apparatus according to embodiments of the present disclosure is fabricated, an open mask for forming an organic light emitting layer only in a predetermined region on the substrate is not required to block moisture propagation, thereby simplifying the fabrication process of the lighting apparatus, and facilitating manufacturing of the lighting apparatus in a roll fabrication process.

BRIEF DESCRIPTION OF THE SEVERAL VIEWS OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 7A through 7E are cross-sectional views sequentially illustrating a method of fabricating the lighting apparatus according to the first embodiment of the present disclosure.

DETAILED DESCRIPTION

Hereinafter, the present disclosure will be described in detail with reference to the accompanying drawings.

The present disclosure provides a lighting apparatus including an organic light emitting device made of an organic material, as opposed to a lighting apparatus including an inorganic light emitting device made of an inorganic material.

An organic light emitting device made of an organic light emitting material has a relatively good luminous efficiency in green and red colors as compared with an inorganic light emitting device. In addition, an organic light emitting device has a relatively larger width in blue, red and green emission peaks as compared with an inorganic light emitting device, and thus the organic light emitting device has an advantage in that the color rendering property thereof is improved and the light of the light emitting apparatus is more similar to the sunlight.

Figure 1:
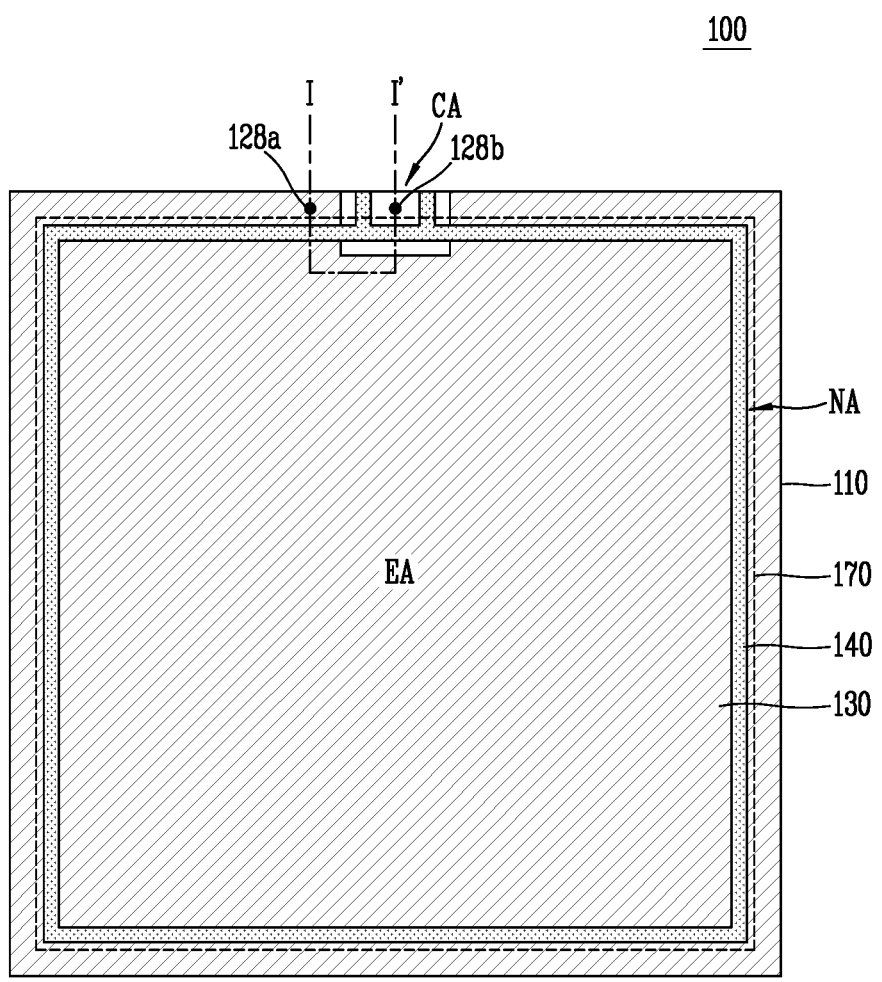
FIG. 1 is a plan view of a lighting apparatus according to a first embodiment of the present disclosure.

FIG. 1 is a plan view illustrating the structure of a lighting apparatus including an organic light emitting device according to a first embodiment of the present disclosure.

As illustrated in FIG. 1, a lighting apparatus 100 according to the present disclosure is a surface-emitting lighting apparatus including a lighting region (EA) that emits light to the outside and a substrate 110. A first electrode and a second electrode (not shown) are disposed over a surface of the substrate 110, and an organic light emitting layer 130 is disposed between the first electrode and the second electrode to form an organic light emitting device in the lighting region (EA). Applying a signal to the first electrode and the second electrode of the organic light emitting device, the organic light emitting layer 130 emits light to output light over the entire lighting region (EA) of the substrate 110.

The organic light emitting layer 130 is formed of an organic light emitting material that outputs white light. For example, the organic light emitting layer 130 may include a plurality of organic light emitting layers, including a blue organic light emitting layer, a red organic light emitting layer and a green organic light emitting layer. Alternatively, the organic light emitting layer 130 may have a tandem structure including a blue light emitting layer and a yellow-green light emitting layer. However, the organic light emitting layer 130 of the present disclosure is not limited to the above structures or layers, but various structures or layers may be included to form the organic light emitting layer 130.

In one or more embodiments of the present disclosure, additional layers may be included in the light emitting region (EA), such as an electron injection layer and a hole injection layer for injecting electrons and holes, respectively, into the organic light emitting layer 130, an electron transport layer and a hole transport layer for transporting the injected electrons and holes, respectively, to the organic light emitting layer 130, and a charge generation layer that generates charges such as electrons and holes.

A step structure, or bank layer 140, is formed in an outer region (NA) that is adjacent to an outer perimeter of the substrate 110. The bank layer 140 prevents moisture from infiltrating into the organic light emitting layer 130 in the lighting region (EA). In general, when a polymer constituting an organic light emitting material is combined with moisture, the light emitting property is rapidly deteriorated to reduce a luminescent efficiency of the organic light emitting layer 130. In particular, when a part of the organic light emitting layer 130 is exposed to the outside in the lighting apparatus, moisture is propagated into the entire lighting apparatus 100 along the organic light emitting layer 130, which reduces the light emitting efficiency of the lighting apparatus 100.

According to the present disclosure, however, the bank layer 140 is disposed adjacent to an entire outer perimeter of the substrate 110, which prevents water from infiltrating into the organic light emitting layer 130 in the lighting region (EA) of the lighting apparatus 100, which is the region of the lighting apparatus 100 that actually emits light. Though not explicitly shown in FIG. 1, the bank layer 140 may include a plurality of step structures or bank layers that are arranged adjacent to one another and having a predetermined width, and the organic light emitting layer 130 is disposed on the first electrode in the lighting region (EA) and on the bank layer 140 in the outer region (NA). Since the plurality of bank layers 140 are formed to have a relatively small width and a height that is greater than a height of the organic light emitting layer 130 in the lighting region (EA) (e.g., the bank layer 140 may have a height of about 1 µm), a plurality of abrupt steps may be generated by the bank layer 140, and the light emitting layer 130 may be disconnected along an outer perimeter (e.g., in the outer region (NA)) of the substrate 110 by such steps, thereby preventing moisture from being propagated to the lighting region (EA) from the outer region (NA).

As described above, according to one or more embodiments of the present disclosure, the bank layer 140 having one or more steps is formed along or adjacent to an outer perimeter of the substrate 110, and the organic light-emitting layer 130 is disconnected according to the structural characteristics of the bank layer 140 to prevent the propagation and infiltration of moisture, and thus an additional process or mask for disconnecting the organic light emitting layer 130 may be omitted.

Hereinafter, a lighting apparatus according to the first embodiment of the present disclosure will be described in more detail with reference to the accompanying drawings.

Figure 2:
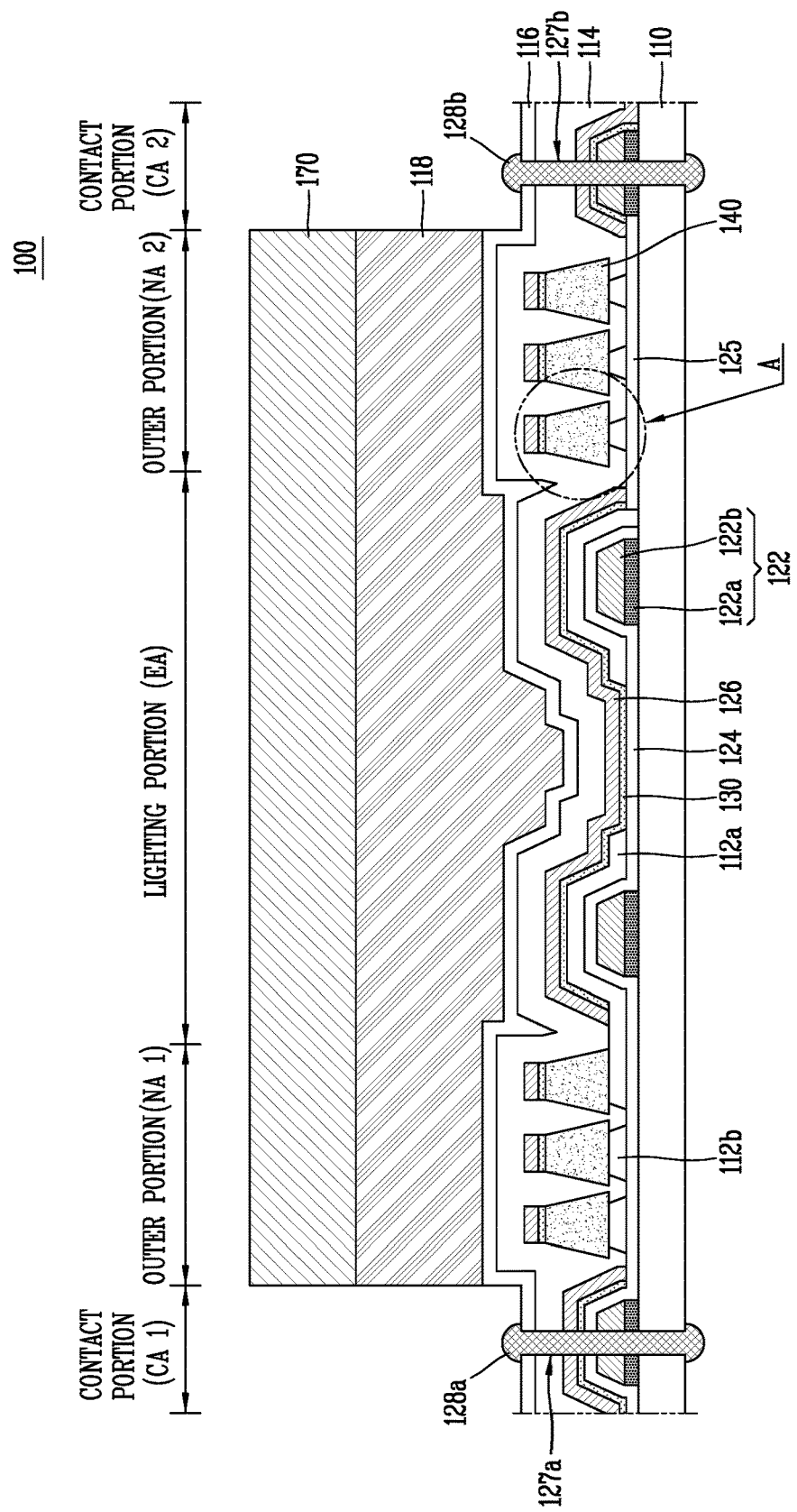
FIG. 2 is a cross-sectional view taken along line I-I' in FIG. 1.

FIG. 2 is a cross-sectional view illustrating a lighting apparatus 100 according to the first embodiment of the present disclosure, taken along line I-I' in FIG. 1. In the following description, the lighting apparatus 100 of the present disclosure will be described as a flexible lighting apparatus having flexibility, but the present disclosure may be applicable not only to a flexible lighting apparatus of the present disclosure but also to a typical non-flexible lighting apparatus.

As illustrated in FIG. 2, the lighting apparatus 100 of the present embodiment may include a lighting region (EA) that actually emits light, outer regions (NA1, NA2) arranged along an outer perimeter of the lighting region (EA), and contact regions (CA1, CA2) for electrically connecting an electrode disposed on the lighting region (EA) to the outside (e.g., to an external power source) to apply a signal to the lighting region (EA).

A first electrode 124 is disposed on a substrate 110 made of a transparent material. For the substrate 110, a solid material such as glass may be used, but a material having flexibility such as plastic may also be used, thereby allowing the fabrication of the lighting apparatus 100 having flexibility. Furthermore, according to embodiments of the present disclosure, a material having flexibility may be used for the substrate 110, which facilitates manufacturing of the lighting apparatus 100 with roll-to-roll processes using a roll, thereby allowing a rapid fabrication of the lighting apparatus 100.

The first electrode 124 is formed on the substrate 110 in the lighting region (EA), the first outer region (NA1) and the first contact region (CA1), and the first electrode 124 may be formed of a transparent conductive material having a good conductivity and a high work function. For example, according to embodiments of the present disclosure, the first electrode 124 may be formed of indium tin oxide (ITO), indium zinc oxide (IZO), a tin oxide based and a zinc oxide based transparent conductive material or the like, and in various embodiments, a transparent conductive polymer may also be used for the first electrode 124.

A connection pattern 125 is disposed on the substrate 110 in the second outer region (NA2). The connection pattern 125 may be separately formed from the first electrode 124, but may also be formed of the same material by the same process.

An auxiliary electrode 122 is disposed on the lighting region (EA) and the contact regions (CA1, CA2) of the substrate 110 and is electrically connected to the first electrode 124. The first electrode 124 has an advantage in that it is formed of a transparent conductive material to transmit light emitted therefrom, but also has a disadvantage in that an electrical resistance thereof is higher than that of a metal. Accordingly, when a large-area lighting apparatus 100 is fabricated, the distribution of voltages applied to a wide lighting area becomes non-uniform due to a large resistance of the transparent conductive material of the first electrode 124, and such a non-uniform voltage distribution does not allow light emission having a uniform luminance on the large-area lighting apparatus 100.

The auxiliary electrode 122 is disposed in a matrix shape with a small width, a mesh shape, a hexagonal shape, an octagonal shape, a circular shape, or the like over the entire lighting region (EA) to uniformly apply a voltage to the first electrode 124 of the entire lighting apparatus 100, thereby allowing light emission having a uniform luminance on the large-area lighting apparatus 100.

As shown in FIG. 2, the auxiliary electrode 122 may be disposed below the first electrode 124, but in alternative embodiments, the auxiliary electrode 122 may be disposed on the first electrode 124. The auxiliary electrode 122 disposed in the contact region (CA) may be used as a path for transferring a voltage to the first electrode 124, but also may brought into contact with the outside to perform the role of a contact electrode for applying an external voltage (e.g., from an external power source) to the first electrode 124.

The auxiliary electrode 122 is made of a metal having a good conductivity such as Al, Au, Cu, Ti, W, Mo or an alloy thereof. As shown in FIG. 2, the auxiliary electrode 122 may be formed with a double layer structure (e.g., layers 122a and 122b), but the auxiliary electrode 122 may also be formed with a single layer. When formed as a double layer structure the layers 122a and 122b may be formed of any metals including those listed above with respect to the auxiliary electrode 122. The layer 122a may be selected to suitably adhere or be attached to the substrate 110.

A first protective layer 112 is deposited on the lighting region (EA) and the outer regions (NA1, NA2) of the substrate 110, and a plurality of step structures or bank layers 140 are disposed on the first protective layer 112b of the outer regions (NA1, NA). The first protective layer 112 may include multiple regions or segments, as shown, including segments 112a and 112b. The first protective layer 112a disposed on the lighting region (EA) covers the auxiliary electrode 122 and the first electrode 124 thereon, but the first protective layer 112a is not disposed in a light emitting region that actually emits light.

The first protective layer 112b disposed on the outer regions (NA1, NA2) is disposed below a plurality of bank layers 140 along an outer perimeter of the substrate 110. Here, the first protective layer 112b is undercut below the bank layer 140, and thus the width of a lower surface of the bank layer 140 is greater than the width of an upper surface of the first protective layer 112b.

Furthermore, the first protective layer 112a in the lighting region (EA) is formed to surround the auxiliary electrode 122 so as to reduce a stepped portion due to the auxiliary electrode 122, and thus various layers to be formed thereafter will be stably formed without being disconnected, that is, the layers formed over the auxiliary electrode 122 in the lighting region (EA) may be continuous layers.

The first protective layer 112 is formed of an inorganic layer such as SiOx or SiNx. However, the first protective layer 112 may also be formed of an organic layer such as photoacryl or a plurality of layers having an inorganic layer and an organic layer.

The bank layer 140 is formed of an organic insulating layer, and a cross section thereof has a tapered triangular shape. The width of a lower surface of the bank layer 140 is greater than the width of an upper surface of the first protective layer 112b, and the first protective layer 112 may have inwardly sloped side surfaces between a lower surface and an upper surface of the first protective layer 112b.

The organic light emitting layer 130 and the second electrode 126 are disposed on the first electrode 124 of the lighting region (EA), on the bank layer 140 of the outer regions (NA1, NA2), and on the first electrode 124 of the contact regions (CA1, CA2). The organic light emitting layer 130 may be formed of a red light emitting layer, a blue light emitting layer, and a green light emitting layer, or may have a tandem structure including a blue light emitting layer and a yellow-green light emitting layer to form a white organic light emitting layer. Furthermore, the organic light emitting layer 130 may include an electron injection layer and a hole injection layer for injecting electrons and holes, respectively, into the organic light emitting layer, an electron transport layer and a hole transport layer for transporting the injected electrons and holes, respectively, to the organic light emitting layer, and a charge generation layer that generates charges such as electrons and holes.

The second electrode 126 may be formed of a metal such as Ca, Ba, Mg, Al or Ag.

The first electrode 124, the organic light emitting layer 130, and the second electrode 126 in the lighting region (EA) form an organic light emitting device. When the first electrode 124 is an anode of an organic light emitting device and the second electrode 126 is a cathode thereof, and a voltage is applied to the first electrode 124 and the second electrode 126, electrons are injected from the second electrode 126 into the organic light emitting layer 130 and holes are injected from the first electrode 124 into the organic light emitting layer 130 to generate excitons within the organic light emitting layer 130. As the excitons decay, light corresponding to an energy difference between LUMO (Lowest Unoccupied Molecular Orbital) and HOMO (Highest Occupied Molecular Orbital) of the organic light emitting layer 130 is generated and emitted in a downward direction (toward the substrate 110 as shown in FIG. 2).

Since the first protective layer 112a is disposed on the auxiliary electrode 122 of the lighting region (EA), the organic light emitting layer 130 on the auxiliary electrode 122 is not directly brought into contact with the first electrode 124, and thus an organic light emitting device is not formed on the auxiliary electrode 122. In other words, the organic light emitting device within the lighting region (EA) is formed only within spaces between the auxiliary electrode 122 formed in a matrix shape, for example.

The organic light emitting layer 130 disposed within the lighting region (EA) is disposed on the first electrode 124 and on the first protective layer 112a, while the organic light emitting layer 130 disposed in the outer regions (NA1, NA2) is disposed on an upper surface of bank layer 140. The bank layer 140 is formed with a thickness suitable to generate a step by the bank layer 140 (e.g., about 1 μm), and the organic light emitting layer 130 within the lighting region (EA) and the organic light emitting layer 130 of the outer regions (NA1, NA2) are disconnected by the step. That is, the organic light emitting layer is discontinuous between the lighting region (EA) and the outer region (NA) due to the step formed by the thickness of the bank layer 140.

Figure 3:
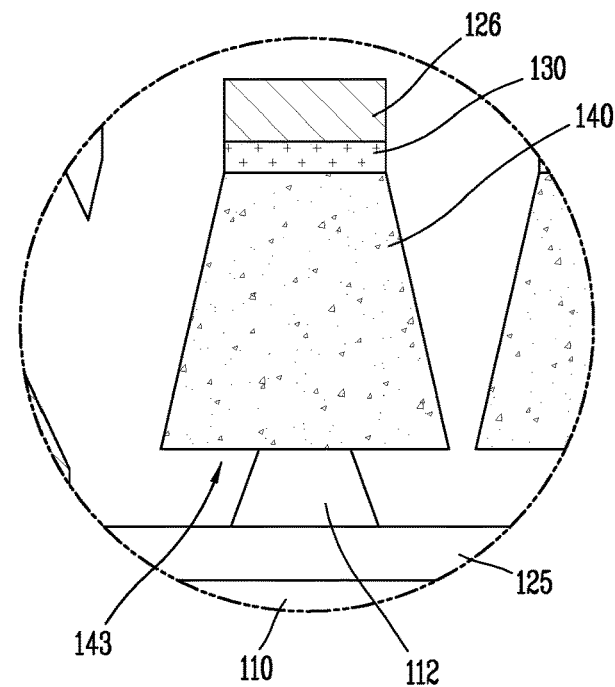
FIG. 3 is an enlarged view illustrating a region A shown in FIG. 2.

FIG. 3 as an enlarged view illustrating a region A in FIG. 2, which illustrates a disconnection between the organic light emitting layer 130 within the lighting region (EA) and the organic light emitting layer 130 of the outer regions (NA1, NA2).

As illustrated in FIG. 3, the bank layer 140 is formed with a height (or thickness) of about 1 μm and has sidewalls that are tapered at a predetermined angle. Thus, a large step is formed between an upper surface of the first electrode 124 and an upper surface of the bank layer 140. Furthermore, the first protective layer 112b is undercut at a lower surface of the bank layer 140, and thus a discontinuous region 143 due to the undercut is formed between a lower surface of the bank layer 140 and an upper surface of the first protective layer 112b. Accordingly, when an organic light emitting material is deposited over the entire substrate 110, the organic light emitting layer 130 is not formed on a side surface, such as the tapered sidewalls, of the bank layer 140, and the organic light emitting layer 130 within the lighting region (EA) and the organic light emitting layer 130 of the outer regions (NA1, NA2) are disconnected from each other. Even when the organic light emitting layer 130 is formed on a side surface of the bank layer 140, the organic light emitting layer 130 within the lighting region (EA) and the organic light emitting layer 130 of the outer regions (NA1, NA2) are disconnected by the discontinuous region 143 between the bank layer 130 and the first protective layer 112b.

As described above, according to embodiments of the present disclosure, as the organic light emitting layer 130 within the lighting region (EA) and the organic light emitting layer 130 of the outer regions (NA1, NA2) are disconnected by the bank layer 140, it may be possible to prevent moisture that penetrates into an external region (e.g., the outer region (NA)) of the organic light emitting layer 130 from being propagated to the organic light emitting layer 130 of the lighting region (EA) that actually emits light along the organic light emitting layer 130. Moreover, according to embodiments of the present disclosure, the organic light emitting layer 130 may be disconnected due to the structural characteristics of the bank layer 140, and thus and additional fabrication process (e.g., an open mask process) may not be required, and as a result, it may be possible to prevent the addition of a fabrication process and resultant cost increase.

The second electrode 126 is also disposed on the organic light emitting layer 130 in the lighting region (EA) and on the bank layer 140 in the outer regions (NA1, NA2), and thus the second electrode 126 in the lighting region (EA) is disconnected from the second electrode 126 in the second outer region (NA2). Therefore, a voltage cannot be applied to the second electrode 126 in the lighting region (EA) through the second contact region (CA2). In order to facilitate electrical connection from the second contact portion (CA2) to the second electrode 126 in the lighting region (EA), according to embodiments of the present disclosure, the second electrode 126 in the lighting region (EA) is electrically connected to the second electrode 126 in the second outer region (NA2) by a connection pattern 125 disposed in the second contact region (CA2).

A second protective layer 114 and a sealant 116 are provided on the substrate 110 and cover the bank layer 140, as well as the other layers as shown in FIG. 2. The second protective layer 114 may be formed of an organic layer such as photoacryl or an inorganic layer such as SiOx or SiNx. In addition, the protective layer 114 may be composed of a plurality of layers having an organic layer and an inorganic layer.

The sealant 116 encapsulates the organic light emitting device to protect the organic light emitting device from external moisture or heat. For the sealant 116, an epoxy compound, an acrylate compound, an acrylic compound or the like may be used.

Instead of forming both the second protective layer 114 and the sealant 116, only one of the second protective layer 114 and the sealant 116 may be formed.

First and second through holes 127a, 127b are formed to extend through the substrate 110, the first electrode 124, the organic light emitting layer 130, the second electrode 126, the second protective layer 114 and the sealant 116 of the contact regions (CA1, CA2). A first contact electrode 128a and a second contact electrode 128b are formed to extend through the first through hole 127a and the second through hole 127b, respectively. The first contact electrode 128a and the second contact electrode 128b may be electrically connected to an external voltage source to apply a voltage to the first electrode 124 and the second electrode 126, respectively. For the first contact electrode 128a and the second contact electrode 128b, any suitable conductive material, such as Ag, may be used.

As shown in FIG. 2, through holes 127a, 127b may be formed through the substrate 110, the first electrode 124, the organic light emitting layer 130, the second electrode 126, the second protective layer 114, and the sealant 116 of the contact regions (CA1, CA2). However, in one or more embodiments, contact holes or vias, instead of the through holes, may be formed in such a manner that the first contact electrode 128a and the second contact electrode 128b are formed within the contact hole, thereby allowing the first contact electrode 128a and the second contact electrode 128b to be electrically connected to an external voltage source. In this case, the contact hole of the first contact region (CA1) is formed to extend through the organic light emitting layer 130, the second electrode 126, the second protective layer 114 and the sealant 116 to contact the first electrode 124 and to connect the first contact electrode 128a to the first electrode 124. The contact hole of the second contact region (CA2) is formed to extend through the second protective layer 114 and the sealant 116 to contact the second electrode 126 and to connect the second contact electrode 128b to the second electrode 126.

An adhesive 118 is applied onto the sealant 116 and a metal foil 170 is disposed thereon to adhere the metal foil 170 to the sealant 116, thereby sealing the lighting apparatus 100. The adhesive 118 may be a photocuring adhesive or a thermosetting adhesive.

As described above, according to embodiments of the present disclosure, the organic light emitting layer 130 may be deposited over the entire substrate 110 without the use of a mask, or open mask, and the organic light emitting layer 130 is disconnected between the lighting region (EA) and the outer region (NA) due to the structural characteristics of the bank layer 140, thereby preventing moisture from being penetrated and propagated into the organic light emitting layer 130 in the lighting region (EA).

Moreover, according to one or more embodiments of the present disclosure, the substrate 110 may be formed of a plastic film having flexibility, thereby allowing fabrication using a roll-to-roll process. Accordingly, it may be possible to allow a rapid fabrication of the lighting apparatus 100, and reduce fabrication cost.

Figure 4:
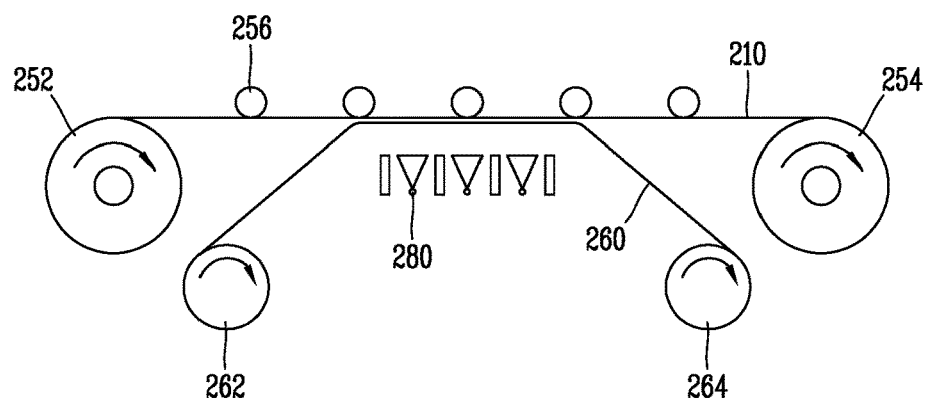
FIG. 4 is a schematic diagram illustrating a roll fabrication apparatus.

FIG. 4 is a view illustrating a typical roll fabrication apparatus for fabricating a flexible lighting apparatus having flexibility.

As illustrated in FIG. 4, a typical roll fabrication apparatus may include a film supply roll 252 configured to supply a plastic film 210, a film collection roll 254 configured to collect the plastic film 210, a guide roll 256 configured to guide the plastic film 210, a mask supply roll 262 configured to supply an open mask 260 (or metal mask), a mask collection roll 264 configured to collect the open mask 260, and a deposition unit 280 configured to deposit an organic material or a metal to form a layer.

According to a roll fabrication apparatus having the foregoing configuration, the plastic film 210, which is used as the substrate 110 of the lighting apparatus 100, is transferred from the film supply roll 252 to the deposition unit 280 while at the same the open mask 260 is transferred from the mask supply roll 262 to the deposition unit 280. Thus, the deposition unit 280 deposits an organic material or metal in a partial region of the plastic film in a state that the open mask 260 is disposed on an entire surface of the plastic film 210.

The open mask 260 for which deposition is completed is separated from the plastic film 210, and the plastic film 210 is collected by the film collection roll 254, and the open mask 260 is collected by the mask collection roll 262.

When a roll fabrication apparatus having the foregoing structure is used, the plastic film 210 may be continuously supplied by the film supply roll 252 to continuously perform the process, thereby allowing a rapid fabrication of the lighting apparatus. However, the roll fabrication apparatus may cause the following problems.

The roll fabrication apparatus may be used to form various metal patterns, but in particular, the roll fabrication apparatus may be advantageously used when forming the organic light emitting layer 130. This is because the organic light emitting layer 130 or the second electrode 126 is not patterned on the substrate 110 by a photo process but instead is entirely deposited over an entire region of the substrate 110 and thus may be easily formed by a roll fabrication process.

However, when an organic light emitting material is entirely deposited on the substrate 110 by the roll fabrication apparatus to form the organic light emitting layer 130, a side surface of the entirely-deposited organic light emitting layer 130 is formed at the same level as that of a side surface of the substrate, and thus the organic light emitting layer 130 is exposed to the outside through a side surface of the lighting apparatus 100. Since the organic light emitting material is vulnerable to moisture, when it is combined with moisture, the organic light emitting material is not only rapidly deteriorated but also easily propagates moisture. Therefore, in order to prevent moisture from being propagated through the organic light emitting layer 130 exposed to the outside to cause a failure in the lighting apparatus 100, the organic light emitting layer 130 should not be exposed to the outside during fabrication of the lighting apparatus 100.

The open mask 260 may block an outer region of the substrate 110 to prevent the organic light emitting layer 130 from being deposited on the outer region of the substrate 110, and the outer region may be sealed with a sealant, an adhesive or the like to seal a side surface of the organic light emitting layer 130, thereby preventing the organic light emitting layer 130 from being exposed to the outside.

However, as illustrated in FIG. 4, when the organic light emitting layer 130 is formed using the open mask 260, a system (for example, a supply roll, a guide roll, a collection roll, etc.) for supplying the plastic film 210 and a system for supplying the open mask 260 should be in-lined, and thus there is a disadvantage in that a length of the process line is long and a length of the open mask 260 is also long. In addition, a difficulty in this process is that the plastic film 210 and the open mask 260 should be not only supplied in a synchronized manner but also aligned in a continuous process. Moreover, the used open mask 260 should be cleaned, but there is difficulty in cleaning the open mask 260 having a long length.

In other words, in order to rapidly fabricate the lighting apparatus 100, a roll process using an open mask should be used, but there is real difficulty in fabricating the lighting apparatus 100 using an actual roll fabrication apparatus due to the use of such an open mask.

However, according to embodiments of the present disclosure, the bank layer 140 may be provided in the lighting apparatus 100, which allows the organic light emitting material to be deposited over an entire region of the substrate 110, and thus, the organic light emitting layer 130 may be disconnected by the bank layer 140 even when a side surface of the organic light emitting layer 130 is exposed to the outside, thereby preventing moisture from infiltrating into the lighting region (EA) through the exposed organic light emitting layer 130. Therefore, when the lighting apparatus 100 according to embodiments of the present disclosure is fabricated, the open mask may not be required, thereby simplifying the fabrication process of the lighting apparatus, and allowing easy application to a roll fabrication process.

Hereinafter, a lighting apparatus according to the present disclosure and a fabrication method by a roll process of a lighting apparatus having a typical structure will be described, and advantages of the fabrication process of the lighting apparatus according to the present disclosure will be described.

Figure 5:
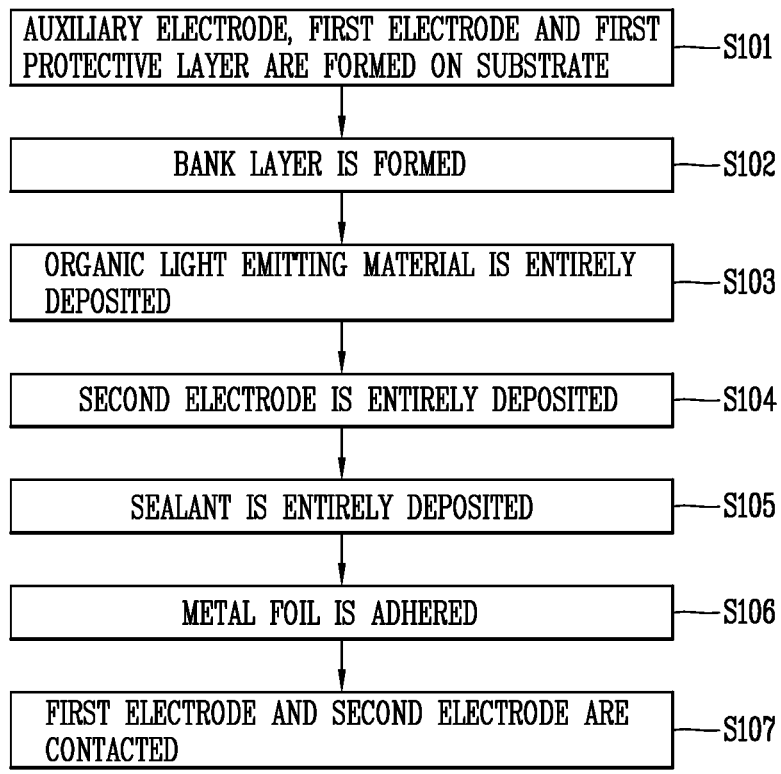
FIG. 5 is a flowchart illustrating a method of fabricating a lighting apparatus according to embodiments of the present disclosure.

FIG. 5 is a flowchart illustrating a fabrication method of a lighting apparatus according to one or more embodiments of the present disclosure.

As illustrated at S101 of FIG. 5, the auxiliary electrode 122, the first electrode 124, and the first protective layer 112 are first formed on the substrate 110, which is formed of a transparent plastic film having flexibility. Next, at S102, an organic material may be deposited and etched to form the bank layer 140. At this time, the auxiliary electrode 122, the first electrode 124, and the first protective layer 112 may be formed, for example, by a photo process using a photoresist and a photomask in a roll fabrication apparatus. Furthermore, the bank layer 140 may also be formed by a photo process. As will be described in detail later, the first protective layer 112 below the bank layer 140 is undercut along with the formation of the bank layer 140.

Subsequently, at S103, an organic light emitting material is deposited on an entire surface of the substrate 110 using the roll fabrication apparatus illustrated in FIG. 4 to form the organic light emitting layer 130. According to embodiments of the present disclosure, an open mask is not required during the deposition of the organic light emitting material, and thus the open mask, the mask supply roll, and the mask collection roll are not required in the roll fabrication apparatus illustrated in FIG. 4. Then, at S104, a metal is deposited on an entire surface of the substrate 110 to form the second electrode. Then, at S105, the sealant 116 may be entirely deposited on the substrate 110.

Subsequently, at S106, the metal foil 170 is adhered to the sealant 116 by the adhesive 118. At S107, the contact electrodes 128a, 128b are formed in the contact regions (CA1, CA2) to electrically connect the first electrode 124 and the second electrode 126.

Figure 6:
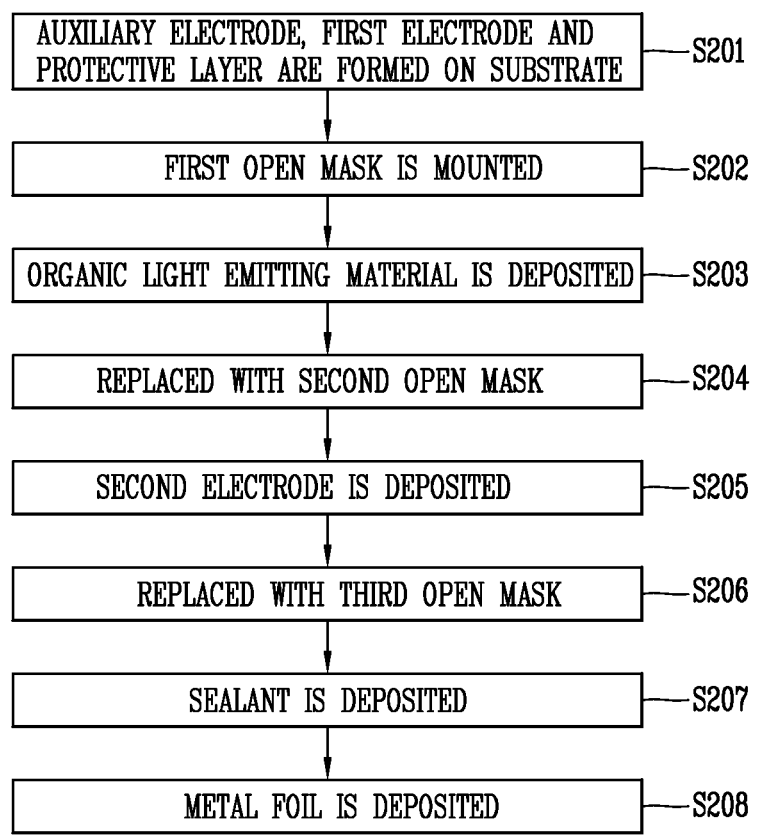
FIG. 6 is a flowchart illustrating a fabrication method of a lighting apparatus having a structure in which a bank layer is not formed.

FIG. 6 is a flowchart illustrating a method of fabricating a general lighting apparatus having a structure in which no bank layer is disposed.

As illustrated in FIG. 6, an auxiliary electrode, a first electrode, and a first protective layer are first formed on a substrate made of a transparent plastic film having flexibility at S201. Subsequently, at S202 and S203, an organic light emitting material is deposited in a state that a first open mask (metal mask) is mounted on an entire surface of the substrate to form an organic light emitting layer.

Then, at S204, the first open mask is replaced with a second open mask that is mounted on the entire surface of the substrate, and at S205, a metal is deposited to form a second metal layer. Subsequently, at S206, the second open mask is replaced with a third open mask mounted on the entire surface of the substrate, and at S207, a sealant is deposited. Finally, at S208, a metal foil is adhered by an adhesive to complete the lighting apparatus.

As described above, in case where the lighting apparatus provided in embodiments of the present disclosure is fabricated using the roll fabrication apparatus, the open mask is not required, and thus the repeated processes of mounting the open mask and replacing the open mask with subsequent open masks are not required as compared with a case of a lighting apparatus having a structure in which the bank layer is not disposed. Therefore, it may be possible to allow a rapid fabrication of the lighting apparatus according to embodiments of the present disclosure.

Moreover, in case of a lighting apparatus having a structure in which the bank layer is not disposed, an open mask used in a previous process should be cleaned when the process for a plastic film provided on a supply roll is completed, and then the plastic film is supplied to the supply roll again. However, in fabricating the lighting apparatus according to embodiments of the present disclosure, the cleaning of the open mask is not required. Therefore, when the lighting apparatus according to embodiments of the present disclosure is fabricated, an additional apparatus for cleaning may not be required, thereby saving cost as well as preventing environmental pollution due to cleaning. Moreover, since a cleaning process between the deposition processes may not be required, a more rapid fabrication process is possible.

Moreover, in case of a lighting apparatus having a structure in which the bank layer is not disposed, an additional apparatus for placing and aligning an open mask in front of the substrate may be required, whereas according to embodiments provided by the present disclosure, such an apparatus may not be required, thereby simplifying the fabrication apparatus as well as reducing cost.

FIGS. 7A through 7E are cross-sectional views illustrating a fabrication method of the lighting apparatus 100 according to the first embodiment of the present disclosure. Here, the illustrated fabrication method is a process carried out in a roll fabrication apparatus using a flexible substrate, but may also be applicable to a conventional fabrication apparatus using a substrate such as glass.

Figure 7A:
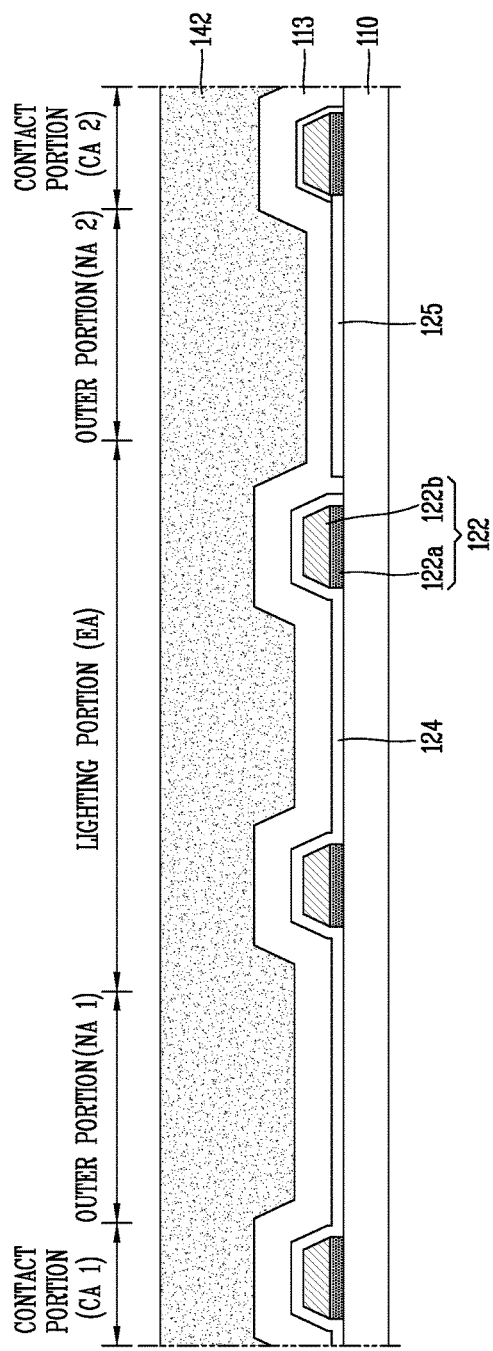

First, as illustrated in FIG. 7A, a metal such as Au, Cu, Ti, W, Mo or an alloy thereof is deposited and etched on the substrate 110 including the lighting region (EA), the outer regions (NA1, NA2) and the contact regions (CA1, CA2) to form the auxiliary electrode 122, which may be made of a single layer or a plurality of layers on the lighting region (EA) and the contact regions (CA1, CA2). Here, the auxiliary electrode 122 is disposed in a matrix shape, a mesh shape, a hexagonal shape, an octagonal shape, or a circular shape over the entire lighting region (EA). Then, a transparent conductive material such as ITO or IZO is deposited and etched over the entire substrate 110 to form the first electrode 124 disposed on the auxiliary electrode 122 of the lighting region (EA), the first outer region (NA1) and the contact regions (CA1, CA2), and to form the connection pattern 125 disposed on the second outer region (NA2). Subsequently, an inorganic insulating layer 113 such as SiNx or SiOx and an organic insulating layer 142 such as photoacryl are successively deposited on the lighting region (EA), the outer regions (NA1, NA2) and the contact regions (CA1, CA2).

Figure 7B:
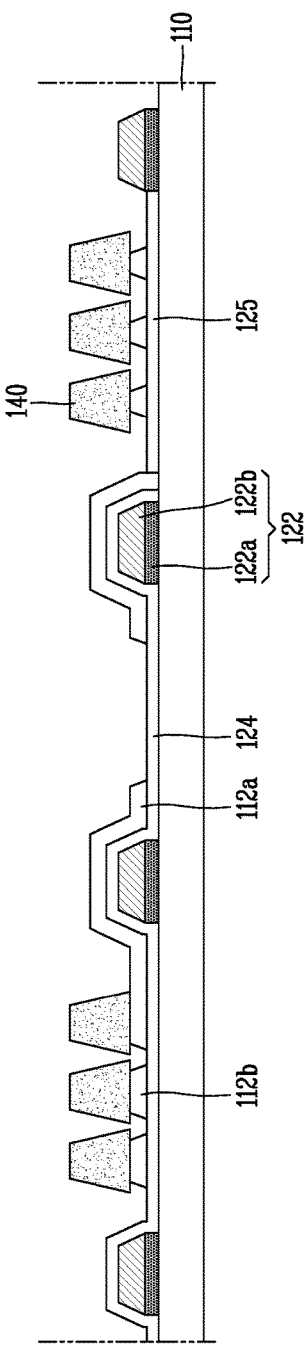

Then, as illustrated in FIG. 7B, the inorganic insulating layer 113 and the organic insulating layer 142 are etched to form the bank layer 140 in the outer regions (NA1, NA2), and to form the first protective layers 112a, 112b on an upper portion and a side portion of the auxiliary electrode 122 in the lighting region (EA), and below a lower portion of the bank layer 140 in the outer regions (NA1, NA2).

Here, the inorganic insulating layer 113 and the organic insulating layer 142 are etched by wet etching using an etching solution, and the inorganic insulating layer 113 is over-etched and the first protective layer 112b below the bank layer 140 is undercut.

Then, as illustrated in FIG. 7C, an organic light emitting material, a metal, an organic insulating material and a sealant are entirely deposited in a sequential manner over an entire region of the substrate 110 to form the organic light emitting layer 130, the second electrode 126, the first protective layer 114 and the sealant 116.

Here, the bank layer 140, which may have a height of about 1 μm, is formed in the outer regions (NA1, NA2) to form a step, and moreover, a discontinuous surface is formed by the undercutting of the first protective layer 112 below the bank layer 140, and thus, the organic light emitting material and the metal are deposited only on an upper surface of the bank layer 140 but are not deposited on the discontinuous surface along a side surface and a lower portion of the bank layer 140 when depositing the organic light emitting material and the metal. Accordingly, it may be possible to prevent moisture in the organic light emitting layer 130 from infiltrating into the lighting region (EA) along the organic light emitting layer 130 that is disconnected from the outer regions (NA1, NA2) and exposed to the outside.

On the other hand, the second electrode 126 is also disconnected by the bank layer 140, but the second electrode 126 in the lighting region (EA) is electrically connected to the auxiliary electrode 122 of the second contact region (CA2) by the connection pattern 125 disposed in the second outer region (NA2).

The second protective layer 114 is formed of an organic insulating material and deposited with a thickness of several micrometers, and is thus deposited over the entire substrate 110 including an upper portion and a side portion of the bank layer 140, and the sealant 116 is formed of an epoxy compound, an acrylate compound or an acrylic resin.

Then, as illustrated in FIG. 7D, an adhesive 118 made of a photocuring adhesive material or a thermosetting adhesive material is coated on the substrate 110, and a metal foil 170 is placed thereon, and then the adhesive 118 is cured to adhere the metal foil 170 thereto.

Then, as illustrated in FIG. 7E, a first through hole 127a and a second through hole 127b are formed on or through the auxiliary electrode 122 in the contact regions (CA1, CA2), respectively. The first and second through holes 127a, 127b are then coated with a metal, such as Ag, to form the first contact electrode 128a and the second contact electrode 128b, respectively. The first contact electrode 128a is electrically connected to the first electrode 124 through the first through hole 127a, and the second contact electrode 128b is electrically connected to the second electrode 126 through the second through hole 127b to complete the lighting apparatus 100. Here, instead of forming the first through holes 127a and the second through holes 127b through the auxiliary electrodes 122 in the contact regions (CA1, CA2), the first and second contact holes may be formed, and the first contact electrode 128a and the second contact electrode 128b may be formed in the first contact hole and the second contact hole, respectively.

Figure 8:
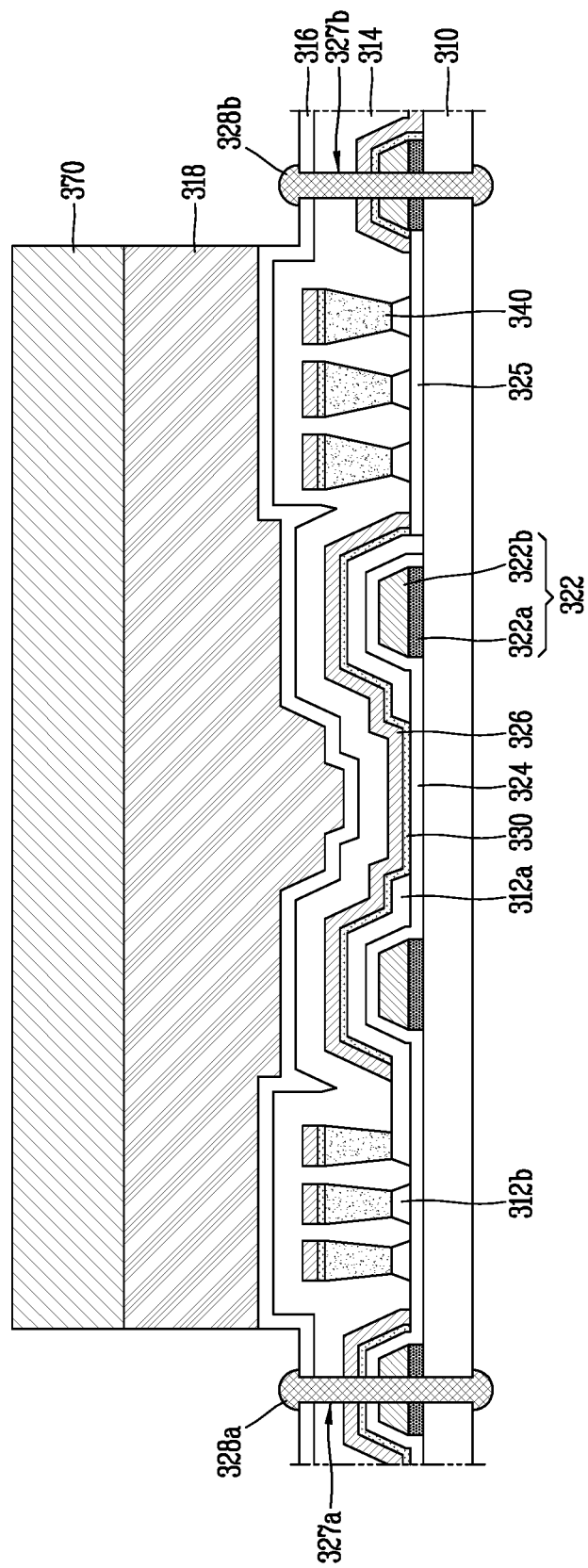
FIG. 8 is a cross-sectional view illustrating a lighting apparatus according to a second embodiment of the present disclosure.

FIG. 8 is a cross-sectional view illustrating the structure of a lighting apparatus 300 according to a second embodiment of the present disclosure. Here, the same structures as those of the lighting apparatus of the first embodiment illustrated in FIG. 2 will not be described, and only other structures will be described in detail. Although the same components are designated by different reference numerals in FIGS. 2 and 8 (for example, 100-based reference numerals in FIG. 2 and 300-based reference numerals in FIG. 8), the description of the same components will be substituted by the earlier description disclosed in FIG. 2.

As illustrated in FIG. 8, even in the lighting apparatus 300 of the second embodiment, an organic light emitting layer 330 and a second electrode 326 are deposited over an entire region of a substrate 310 by entire deposition. However, according to the lighting apparatus 300 of this embodiment, a plurality of partition walls 340 are formed in the outer regions (NA1, NA2), respectively. The partition walls 340 are disposed along or adjacent to an entire outer perimeter of the substrate 310 with a predetermined width.

The partition wall 340 is formed of an organic insulating material, and may have a height of about 2 μm. The width of an upper surface of the partition walls 340 is greater than that of a lower surface thereof. A first protective layer 312b having a width similar to the width of the lower surface of the partition wall 340 is formed below the partition wall 340.

As described above, a large step is formed by the partition wall 340 and the first protective layer 312b and a side surfaces of the partition walls 340 is formed in a reverse tapered shape, i.e., the side surfaces of the partition walls 340 slope inwardly from an upper surface to a lower surface of the partition walls 340. When the organic light emitting material and the metal are deposited, the organic light emitting layer 330 and the second electrode 326 are not formed on a sidewall of the partition wall 340 due to the step and the reverse tapered shape. Accordingly, the organic light emitting layer 330 within the lighting region (EA) is disconnected from the organic light emitting layer 330 disposed on an upper surface of the partition wall 340 in the outer regions (NA1, NA2). Thus, even when the organic light emitting layer 330 is exposed to the outside through a side surface of the substrate 310 and moisture permeates into the organic light emitting layer 330 in the outer regions (NA), the moisture does not propagate to the organic light emitting layer 330 within the lighting region (EA). As a result, it may be possible to prevent the deterioration of the organic light emitting layer 330 due to moisture infiltration, thereby preventing a failure in the lighting apparatus 300.

As described above, even in the lighting apparatus 300 of this embodiment, the organic light emitting layer 330 is disconnected by the partition wall 340, and thus an organic light emitting material may be entirely deposited on the substrate 310 to form the organic light emitting layer 330. Accordingly, an additional open mask may not be required during the deposition, thereby simplifying fabricating process as well as allowing effective application to a roll fabrication apparatus.

On the other hand, a difference between the lighting apparatus of the first embodiment and the lighting apparatus of the second embodiment is the bank layer and the partition wall. However, since the bank layer and the partition wall are similar in their shapes and have the same or similar functions, both of them may be referred to as bank layers or partition walls. Furthermore, they may be referred to as step structures capable of disconnecting the organic light emitting layer between the outer region (NA) and the lighting region (EA).

In the foregoing detailed description, embodiments of the present disclosure have been described with a specific configuration, but the present disclosure is not limited to such a specific configuration. Embodiments provided by the present disclosure include a bank layer or partition wall that is formed in an outer region (NA) of the lighting apparatus to disconnect the organic light emitting layer by a step, and may be applicable to lighting apparatuses having all currently known structures.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A lighting apparatus, comprising:
   a substrate having a lighting region, an outer region, and an electrical contact region;
   an organic light emitting device on the substrate in the lighting region, the organic light emitting device including a first electrode, an organic light emitting layer, and a second electrode; and
   a step structure on the substrate in the outer region, the organic light emitting layer formed over an entire region of the substrate to be positioned on the first electrode in the lighting region and the step structure in the outer region, the organic light emitting layer being disconnected between the outer region and the lighting region.

2. The lighting apparatus of claim 1, wherein the step structure is a tapered bank layer having side walls that slope outwardly from an upper surface to a lower surface of the tapered bank layer.

3. The lighting apparatus of claim 2, wherein the organic light emitting layer is disposed on the upper surface of the tapered bank layer and is disconnected along a side wall of the tapered bank layer.

4. The lighting apparatus of claim 1, wherein the step structure is a reverse tapered partition wall having side walls that slope inwardly from an upper surface to a lower surface of the partition wall.

5. The lighting apparatus of claim 4, wherein the organic light emitting layer is disposed on the upper surface of the partition wall and is disconnected along a side wall of the partition wall.

6. The lighting apparatus of claim 1, further comprising:
   an auxiliary electrode disposed in the lighting region and in the contact region of the substrate, the auxiliary electrode being connected to the first electrode.

7. The lighting apparatus of claim 6, wherein the auxiliary electrode is disposed in the lighting region having at least one of: a matrix shape, a mesh shape, an octagonal shape, a hexagonal shape, and a circular shape.

8. The lighting apparatus of claim 7, further comprising:
   a first contact electrode and a second contact electrode, the first and second contact electrodes disposed in the contact region and electrically connected to the first electrode and the second electrode, respectively, through respective through holes.

9. The lighting apparatus of claim 8, further comprising:
   a connection pattern disposed in the outer region, the connection pattern electrically connects the second contact electrode in the contact region to the second electrode in the lighting region.

10. The lighting apparatus of claim 9, wherein the connection pattern and the first electrode are formed of a same material.

11. The lighting apparatus of claim 1, further comprising:
    a protective layer disposed on the substrate;
    a sealant disposed on the protective layer; and
    a metal foil adhered to the sealant by an adhesive.

12. A method of fabricating a lighting apparatus, the method comprising:
    forming a step structure in an outer region of a substrate, the outer region being adjacent to an outer perimeter of the substrate;
    forming a first electrode in a lighting region of the substrate;
    forming an organic light emitting layer on the first electrode in the lighting region and on the step structure in the outer region by depositing an organic light emitting material on an entire region of the substrate, respective portions of the organic light emitting layer on the first electrode and on the step structure being disconnected from each other between the outer region and the lighting region; and
    forming a second electrode on the organic light emitting layer by entirely depositing a metal on the entire region of the substrate.

13. The method of claim 12, further comprising:
    forming an auxiliary electrode in the lighting region, the auxiliary region being in electrical contact with the first electrode in the lighting region.

14. The method of claim 12, wherein forming the step structure includes:
    depositing a first insulating layer on the entire region of the substrate;
    depositing a second insulating layer on the first insulating layer; and
    etching the first insulating layer and the second insulating layer to form a protective layer and a step structure on the protective layer, the protective layer below the step structure being undercut.

15. The method of claim 12, further comprising:
    forming a sealing material on the second electrode; and
    adhering a metal foil to the sealant.

16. The method of claim 15, wherein the organic light emitting material, the metal, and the sealing material are sequentially deposited on the entire region of the substrate.

17. The method of claim 16, wherein the deposition of the organic light emitting material, the metal, and the sealing material is performed utilizing a roll fabrication apparatus.

18. The method of claim 17, wherein the organic light emitting material, the metal, and the sealing material are entirely deposited on the substrate without an open mask.

19. A lighting apparatus, comprising:
a substrate having a lighting region, an outer region, and an electrical contact region;
a first electrode on the substrate;
a bank structure on the substrate, the bank structure positioned in the outer region;
an organic light emitting layer formed over an entire region of the substrate to be positioned on the first electrode in the lighting region, and on the bank structure in the outer region, the organic light emitting layer being discontinuous between the lighting region and the outer region; and
a second electrode on the organic light emitting layer, the first electrode, the organic light emitting layer, and the second electrode together forming an organic light emitting device in the lighting region of the substrate.

20. The lighting apparatus of claim 19 wherein the bank structure includes an upper surface, a lower surface, and tapered sidewalls extending between the upper and the lower surface, the organic light emitting layer being discontinuous between the lighting region and the lower surface of the bank structure.

21. The lighting apparatus of claim 1, wherein the first electrode is formed continuously over the lighting region, the outer region and the electrical contact region.

22. The lighting apparatus of claim 2, further comprising a protective layer positioned below the tapered bank layer and being undercut such that a width of a lower surface of the tapered bank layer is greater than a width of an upper surface of the protective layer.

* * * * *